United States Patent [19]
Csicsatka et al.

[11] 3,991,374
[45] Nov. 9, 1976

[54] CONTROLLABLE BANDWIDTH IF FILTER CIRCUIT FOR RADIO RECEIVERS

[75] Inventors: Antal Csicsatka, Utica, N.Y.; Henry P. Lee, Decatur, Ill.

[73] Assignee: General Electric Company, Syracuse, N.Y.

[22] Filed: Feb. 26, 1975

[21] Appl. No.: 553,278

[52] U.S. Cl. .............................. 325/490; 325/383, 427; 179/15 BT
[51] Int. Cl.$^2$ ................................. H04B 1/16
[58] Field of Search ............ 325/36, 379, 381, 383, 325/387, 427, 462, 463, 465, 464, 477, 488, 489, 490; 179/15 BT; 178/DIG. 19; 333/17 R, 70 R; 330/21, 154

[56] References Cited
UNITED STATES PATENTS

| | | | |
|---|---|---|---|
| 2,052,703 | 9/1936 | Farnham | 333/70 R |
| 3,110,004 | 11/1963 | Pope | 325/427 |
| 3,264,566 | 8/1966 | Kaufman et al. | 325/465 |
| 3,495,031 | 2/1970 | Poppa | 178/DIG. 19 |
| 3,633,119 | 1/1972 | Balbes | 333/70 R |

Primary Examiner—Robert L. Griffin
Assistant Examiner—Jin F. Ng
Attorney, Agent, or Firm—Marvin A. Goldenberg

[57] ABSTRACT

Controllable bandwidth IF filter circuit for radio receivers generally, but having particular application to quadraphonic radio receivers intended for use in a quadraphonic system that is compatible with existing monophonic and biphonic equipment, said filter circuit being automatically adjusted in a digital manner to exhibit one of several different bandwidths in response to a pair of transmitted control signals present in the quadraphonic transmission so as to provide optimum receiver operation for the particular mode of broadcast being received, especially in terms of an improved protection ratio and signal to noise ratio for the received signal. The noted bandwidth adjustments are accomplished by modifying the values for certain of the component in the filter's tuned circuit and coupling sections through their selective connection into the circuit by means of semiconductor switching devices operated in response to said pair of control signals.

19 Claims, 5 Drawing Figures

CONTROLLABLE BANDWIDTH IF FILTER CIRCUIT FOR RADIO RECEIVERS

BACKGROUND OF THE INVENTION

The invention pertains generally to the field of FM stereophonic multiplex transmission and has particular reference to a FM radio receiver capable of receiving more than a single mode of transmission, including, e.g., monophonic, biphonic (two channel stereophonic) and quadraphonic (four channel stereophonic) broadcasts. More specifically, the invention pertains to the IF filter circuit portion of such FM radio receiver.

FM stereophonic broadcast has been defined by the Federal Communications Commission as the transmission of a stereophonic program by a single FM broadcast station utilizing the main channel and a stereophonic subchannel. In accordance with the present FCC FM broadcast standard, the main channel is composed of the band of audio frequencies from 50 Hz to 15 KHz, and the stereophonic subchannel is provided in the band of frequencies from 23 to 53 KHz, containing a suppressed subcarrier at 38 KHz and its associated 15 KHz upper and lower sidebands. The main and subchannel signals frequency modulate the main carrier along with a 19 KHz pilot signal which is employed to reconstitute the suppressed subcarrier in the receiver. By the same token and for purposes of the present discussion, FM quadraphonic broadcast may be defined as the transmission of a quadraphonic program by a single FM broadcast station utilizing the main channel, the stereophonic subchannel and two additional subchannels. One such system is described in U.S. Pat. No. 3,934,092, entitled "Four Channel Stereophonic System", for the invention of Antal Csicsatka, which is assigned to the assignee of the present invention. In this system a third subchannel is provided in the band of frequencies from 23 to 53 KHz, which is a suppressed subcarrier, double sideband modulation in quadrature with the existing stereophonic subchannel. A fourth subchannel is provided in the band of frequencies from 61 KHz to slightly above 76 KHz, containing a suppressed subcarrier at 76 KHz and a vestigial sideband modulation. A 76 KHz pilot signal is also transmitted for indicating at the receiver the presence of a quadraphonic transmission and for providing an automatic operation of the receiver's quadraphonic decoder.

Monophonic FM receivers, capable of receiving only monophonic broadcasts, normally provided an IF bandwidth of about 150 KHz, which figure is measured at the 3 db attenuation points. A bandwidth of this order establishes a compromise in providing a low distortion signal at the receiver output through the inclusion of a sufficient number of the higher order sidebands in the rf spectrum, without admitting excessive noise or interfering signals from adjacent channels. For two channel stereophonic receivers which must accomodate a wider modulation band of stereophonic transmission, it is necessary to increase the IF bandwidth. A bandwidth of about 180 KHz at the 3 db attenuation points is employed in most present day FM stereophonic receivers. Since stereophonic receivers are also capable of receiving monophonic broadcasts, opening the IF bandwidth to this extent does produce some degradation of the received monophonic signal by interfering signals, which for all but high performance equipment is normally within tolerable limits.

Quadraphonic receivers, however, in order to reproduce a low distortion signal from the further increased modulation band of quadraphonic transmission, must provide a substantially wider IF bandwidth, in the order of 230 KHz at the 3 db attenuation points. A bandwidth significantly less than this would create distortion and reduce separation for the quadraphonic signal at the receiver output. A wider bandwidth, on the other hand, would not be of benefit because the transmitted signal is restricted to an IF bandwidth of such magnitude, in order to satisfy Federal Communications Commission requirements directed to avoiding adjacent channel interference.

By increasing the receiver IF bandwidth to 230 KHz, two principal problems are introduced in the reception of monophonic and two channel stereophonic broadcasts, which the quadraphonic receiver must be able to receive as a compatibility requirement. The first of these is adequacy of protection ratio. For purposes of the present discussion, protection ration, which is related to receiver selectivity, is a figure of merit that compares the magnitude of the desired signal voltage from a selected channel with the magnitude of undesired signal voltages from any other channels that are present at the receiver input. It may be expressed as the ratio in db of an undesired carrier signal voltage to the desired carrier signal voltage, where the undesired carrier signal produces an audio signal of 30 db attenuation with respect to the audio signal produced by the desired carrier signal. The increased IF bandwidth of the quadraphonic receiver is found to cause a notable reduction in protection ratio. Thus, with the receiver switched to the monophonic receiving mode, the widened IF bandwidth may subject the receiver to interference from undesired signals, which may be monophonic, biphonic or quadraphonic signals transmitted on other than the selected channel. Similarly, the widened IF bandwidth may also result in interference from such undesired signals when the quadraphonic receiver is switched to receive in the two channel stereophonic mode. On the other hand, the receiver need not be subject to interference from undesired signals when in the quadraphonic receiving mode because the reception range of quadraphonic transmission is substantially less than that of either monophonic or two channel stereophonic transmission, which acts to compensate for the reduced selectivity of the IF filter bandwidth.

As to the second problem posed by the increased IF bandwidth, the total noise introduced into the IF stage of the quadraphonic receiver will be increased during reception in the monophonic and two channel stereophonic modes due to the widened IF bandwidth, resulting in a degraded overall receiver performance when operating in either of these modes.

No practical solution to the above noted problems is known to exist for quadraphonic receivers. Although techniques for providing an automatic adjustment of filter bandwidth are, in general, known to the art, no circuitry is known to have been evolved which could be used for the present application or which would have the advantages of the present invention.

SUMMARY

It is accordingly a principal object of the invention to provide an improved controllable bandwidth IF filter circuit that may be employed in a compatible quadraphonic broadcast receiver capable of receiving monophonic, biphonic and quadraphonic modes of radio broadcast for the purpose of optimizing the IF bandwidth characteristics of said receiver for each broadcast mode received.

A further object of the invention is to provide an improved controllable bandwidth IF filter circuit which may be automatically adjusted to exhibit one of several accurate bandwidth values.

Another object of the invention is to provide an improved controllable bandwidth IF filter circuit which is of relatively simple and inexpensive design.

Another object of the invention is to provide a novel compatible quadraphonic receiver having a controllable bandwidth IF filter characteristic that is automatically adjusted for optimum bandwidth performance in response to a pair of control signals indicative of the broadcast mode being received.

It is another object of the invention to provide a novel compatible quadraphonic receiver having a controllable bandwidth IF filter characteristic for optimizing the receiver protection ratio and signal to noise ratio in each broadcast mode received.

These and additional objects of the invention are achieved principally with respect to quadraphonic radio receivers capable of receiving monophonic, biphonic and quadraphonic modes of radio broadcast, by incorporating into such receivers a novel multiple stage IF filter circuit comprising several LC tuned circuit sections joined together by several capacitive coupling sections between the input and output terminals of said filter circuit. Included within the LC tuned circuit and capacitive coupling sections are a number of circuit filter elements selectively connected in the circuit through the employment of digital techniques for providing a relatively accurate adjustment of the IF bandwidth to one of several predetermined values. Each LC tuned circuit section includes, at a minimum, a parallel connected inductance and capacitance. Each capacitive coupling section is in a "T" configuration and includes two series arms serially connected to the adjoining LC tuned circuit sections, and a shunt arm connected between the junction of said series arms and a ground point in the circuit. Each series arm comprises a fixed capacitor, and the shunt arm comprises at least a first path including a capacitor connected in series with a control diode, one side of which is tied to ground, that selectively connects the associated shunt capacitor into the circuit. Control means, forming an integral part of the controllable bandwidth IF filter circuit, responds to a pair of control signals which are derived from the 19 KHz and 76 pilot signals for controlling the operation of the diode so that when nonconducting, the diode introduces into the circuit a relatively low capacitance for a relatively high coupling coefficient. This occurs in each capacitive coupling section during quadraphonic reception and together with additional adjustments of the IF filter causes the filter to assume its maximum bandwidth, which is optimum for quadraphonic reception. During biphonic reception, the first path diode in each coupling section connects its associated capacitor into the circuit for reducing the coupling coefficient, and the bandwidth is reduced to an intermediate value, which is optimum for this mode of reception.

In accordance with a further aspect of the invention, at least one of the LC tuned circuit sections also includes a load resistance selectively connected in parallel with the LC components by means of a further control diode, one side of which is at ground. Responsive to the control means, this diode connects a relatively low resistance in parallel with the LC components during quadraphonic and biphonic reception, which resistance causes the LC tuned circuit to exhibit a relatively low Q. During monophonic reception, however, the further control diode connects an increased load resistance in parallel with the LC components, which increases the Q of the tuned circuit and thereby further reduces the IF filter bandwidth to its minimum value, which is optimum for monophonic reception.

In accordance with a further aspect of the invention, the shunt arm of at least one coupling section may comprise a second path including a second capacitance-control diode series pair, the additional shunt capacitance being connected into the circuit by the associated ground connected diode under control of the control means during monophonic reception for contributing to a reduction of the IF filter bandwidth to its minimum value. This capacitance is disconnected from the circuit during biphonic and quadraphonic reception for contributing to an increase in the IF bandwidth.

In accordance with yet another aspect of the invention, circuit means are provided to compensate for any tendency for the IF filter center frequency to shift as a result of changing the coupling capacitance. This is done by correspondingly changing the capacitance of at least one of the LC tuned circuit sections. Accordingly, by means of a transformer connection additional shunt capacitance is connected in the tuned circuit section, which capacitance partially determines the value of the C of the tuned circuit section. By means of another control diode responsive to the control means, the value of the additional shunt capacitance is changed in inverse relationship to a change in the shunt capacitance of the coupling section, so as to maintain the overall tuned circuit shunt capacitance C, and therefore the filter center frequency, approximately constant.

BRIEF DESCRIPTION OF THE DRAWING

While the specification concludes with the claims which particularly point out and distinctly define that subject matter which is regarded as the invention, it is believed that the invention will be more clearly understood when considering the following detailed description taken in connection with the accompanying figures of the drawing, in which:

DESCRIPTION OF THE PREFERRED EMBODIMENTS

Figure 1:
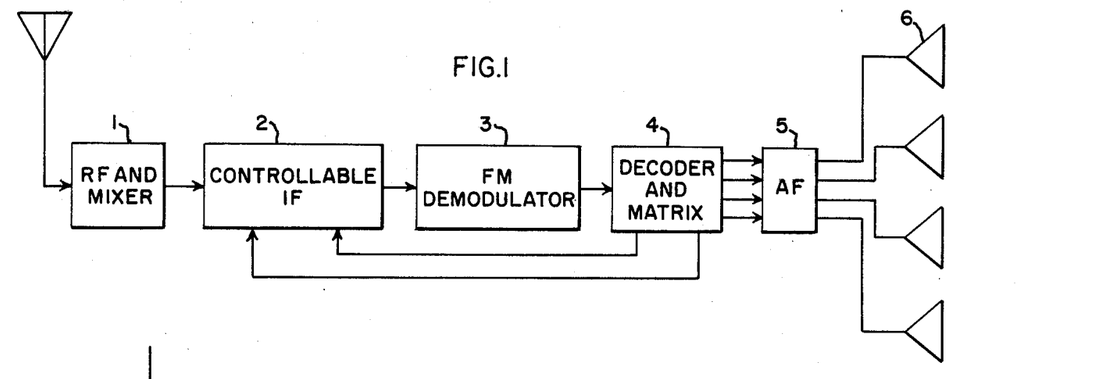
FIG. 1 is a block diagram of a quadraphonic receiver which incorporates the novel controllable bandwidth IF filter circuit of the present invention.

Referring now to FIG. 1, there is illustrated a block diagram of a FM quadraphonic receiver which incorporates the controllable bandwidth IF filter circuit of the present invention. Although having particular application to a quadrareceiver, this filter may be employed with advantage in other radio receivers and communication systems where variable bandwidth filters are required or desirable. The receiver is seen to comprise an RF and mixer stage 1 for amplifying and converting the received RF signal to an IF signal. The output of stage 1 is coupled to an IF stage 2 which includes the controllable IF bandwidth filter circuit. The output of the IF stage is coupled in turn to an FM demodulator 3 for demodulating the IF signal and deriving the spectrum of audio frequency signals. A decoder and matrix 4 provides a separation of the audio signals, which are coupled to an audio frequency or AF stage 5 and to four loudspeakers 6. The decoder and matrix circuit 4 includes means for generating control signals which are fed back to the IF stage 2 for controlling the IF bandwidth.

Figure 2:
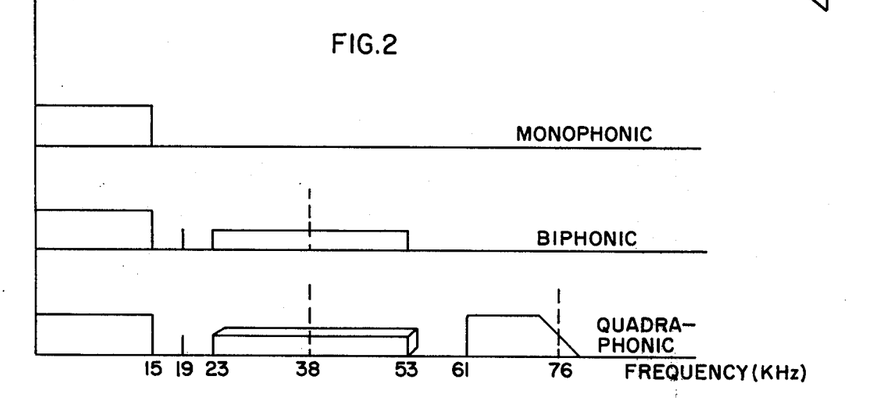
FIG. 2 is a graph illustrating the frequency spectra of modulating signals for the various broadcast modes that may be received by the quadraphonic receiver of FIG. 1.

The receiver shown in FIG. 1 is of a compatible type, i.e., capable of receiving quadraphonic, biphonic and monophonic broadcasts. FIG. 2 shows a graph of the frequency spectra of modulating signals for these various modes of broadcast, the frequency spectrum for the quadraphonic signal corresponding to that contained in the aforementioned U.S. Pat. No. 3,934,092. It is seen that for monophonic transmissions only the audio frequencies of 0 to 15 KHz are employed to modulate the carrier frequency. For a biphonic mode of broadcast, a second channel is added to the transmission within a frequency band in the range of 23 to 53 KHz containing a suppressed subcarrier at 38 KHz and its 15 KHz upper and lower sidebands. The second channel is also employed to modulate the carrier frequency. For a quadraphonic mode of broadcast, a third and fourth channel are added to the transmission. In the graph of FIG. 2 the third channel occupies the band of frequencies of 23 to 53 KHz in quadrature with the frequencies of the second channel, being also a double sideband suppressed subcarrier signal. The fourth channel occupies a band of frequencies from 61 KHz to about 78 KHz, containing a suppressed subcarrier at 76 KHz and a vestigial sideband modulation. Also modulating the carrier frequency are a first pilot signal at 19 KHz which is present during biphonic and quadraphonic transmission, and a further pilot signal at 76 KHz which is present only for quadraphonic transmission. In addition to reconstituting the subcarrier frequencies within the receiver, which is the principal function of the 19 KHz pilot signal, these pilot signals perform various control functions within the receiver. In accordance with the present invention, the two pilot signals are additionally employed to automatically control the IF filter bandwidth as a function of the mode of transmission.

The illustrated quadraphonic frequency spectrum corresponds to that contained in the aforementioned U.S. Pat. No. 3,934,092. However, systems providing other quadraphonic frequency spectra are also known to exist, such as where the fourth channel subcarrier frequency is at greater than 76 KHz, or where a double sideband or upper sideband modulation is employed either at 76 KHz or a greater subcarrier frequency, for which the present controllable bandwidth IF filter circuit would also have useful application.

From the graph of FIG. 2 it is seen that quadraphonic transmission has a substantially greater frequency spectrum than that of either biphonic or monophonic transmission. It may be noted at this point that the quadraphonic frequency spectrum of FIG. 2 represents about the minimum spectrum necessary for transmitting four separate channels of information. In the other formats referred to above the increase in frequency spectrum is still more pronounced. To accommodate this increased spectrum, the IF filter bandwidth of the receiver must be wider than that required for either a biphonic or monophonic reception. If the receiver were to employ an IF filter with a bandwidth fixed at this wider value, it would result in poor selectivity characteristics and inadequate protection ratios during biphonic and monophonic reception. In addition, excess noise would be introduced to reduce the signal to noise ratio of the received signals in these broadcast modes. The present invention overcomes these problems by providing an IF filter with a controllable bandwidth, which is automatically adjusted and matched to the particular mode of broadcast being received, so as to provide an optimum receiver operation in each instance. This control of the IF filter is done in digital fashion through relatively simple and inexpensive circuit modifications of the filter circuit.

In the operation of the receiver of FIG. 1, the IF filter within IF stage 2 is automatically controlled to exhibit an IF bandwidth of about 150 KHz measured at the 3 dn attenuation points during monophonic transmissions. This bandwidth is found to pass a sufficient number of the higher order sidebands of the modulation signal so as to provide a relatively low distortion demodulated audio signal in the receiver output. It also provides for an adequate protection ratio for minimizing interference from undesirable signals that may be present on adjacent channels. Control of the IF bandwidth is effected in response to a pair of control signals generated within the decoder and matrix stage 4, as will be more fully described when considering the schematic circuit diagrams of FIGS. 3 and 5. Other operation of the receiver in respect to the functioning of components 1, 3, 4 and 5 does not form a part of the present invention and will not be further described herein. A detailed description of these components and their operation is provided in applicant's previously referenced U.S. Pat. No. 3,934,092.

During biphonic reception, the IF bandwidth is widened to about 180 KHz at the 3 db attenuation points, in response to control signals from decoder and matrix stage 4, for providing a relatively low distortion demodulated audio signal. For biphonic transmission an IF bandwidth on the order of 180 KHz is found to represent a suitable compromise in obtaining a relatively low distortion signal and an adequate protection ratio.

With respect to quadraphonic transmissions, the IF bandwidth is substantially increased to about 230 KHz at the 3 db attenuation points for providing, in response to control signals from stage 4, a relatively low distortion demodulated audio signal in the fourth channel. Although the protection ratio is considerably reduced by the widened IF bandwidth, quadraphonic transmissions can tolerate a lower protection ratio. This is due primarily to the fact that the reception area of quadraphonic transmission is appreciably less than that of biphonic and monophonic transmissions, which increases the relative magnitude of the desired signal to any undesired signals.

Figure 3:
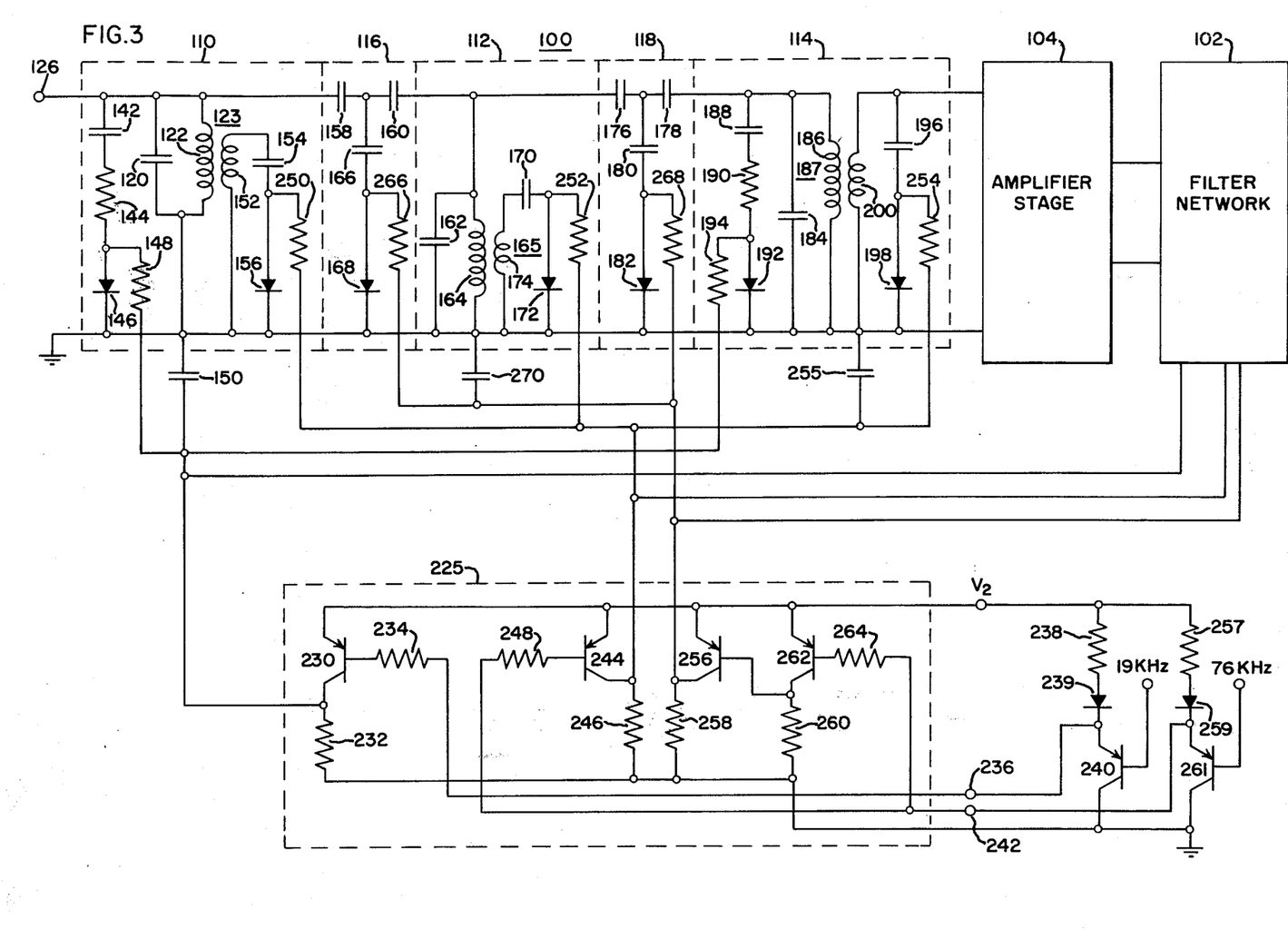
FIG. 3 is a schematic circuit diagram of one embodiment of a controllable bandwidth IF filter circuit in accordance with the invention.

Referring to FIG. 3, there is illustrated a schematic circuit diagram of a controllable bandwidth IF filter circuit and the control circuitry therefor, in accordance with a first embodiment of the invention. The IF filter is composed of a pair of three stage filter networks 100 and 102, with an intermediate amplifier stage 104 connecting the pair of filter networks. Amplifier 104 may be of conventional circuitry serving to equalize the insertion loss of the signal in traversing filter network 100, and is therefore shown only in block form. Filter network 102 is identical in its circuit configuration to network 100 and thus it too is shown only in block form.

Filter network 100 comprises LC tuned circuit sections 110, 112 and 114 coupled together by capacitive coupling sections 116 and 118. Tuned circuit section 110 includes a capacitor 120 connected in parallel with an inductor 122. An input terminal 126, to which is applied the IF signal from the preceding RF and mixer stage, is connected to the upper junction of tuning components 120 and 122, the lower junction of these tuning components being connected to ground. Section 110 further includes the series connected of a RF by-pass capacitor 142, resistor 144 and control diode 146 connected from input terminal 126 to ground. Control diode 146 has its cathode connected to ground, as do all of the diodes in the filter network. Furthermore, the diodes in the network each function as a switch, providing a closed circuit when in the conducting state and being effectively open circuited and exhibiting a very low capacitance in the order of 1 pf when in the nonconducting state.

The junction of resistor 144 and diode 146 is connected by a resistor 148 and RF bypass capacitor 150 to ground. The diode 146, responsive to signals from the control circuit 225, to be considered in more detail subsequently, functions to connect into the tuned circuit section 110 only the resistor 144 when conducting and to connect the serial combination of resistors 144 and 148 when nonconducting. The resistance of resistor 148 is an order of magnitude greater than that of resistor 144 so that the tuned circuit section is, in effect, loaded when the diode conducts and unloaded when the diode is nonconducting. The recited alternative connection serves to alter the Q of the tuned circuit section from a relatively low value when loaded to a high value when unloaded.

Inductor 122 also forms the primary winding of a tranformer 123 of which the secondary winding 152 has its lower terminal connected directly to ground and its upper terminal connected through the serial combination of a capacitor 154 and control diode 156 to ground. By controlling the conduction of diode 156, the capacitor 154 may be reflected back through the transformer coupling with a reduced magnitude that is effectively in shunt with tuning components 120 and 122 for purposes of frequency compensation, as will be further described.

Coupling section 116 includes a pair of series arms and a shunt arm, the first series arm including a capacitor 158 connected to the output of section 110 at the upper junction of tuning components 120 and 122. The second series arm includes a capacitor 160 connected to the input of tuned circuit section 112 at the upper junction of its tuning components, capacitor 162 and inductor 164, whose lower junction is connected to ground. The shunt arm of coupling section 116 includes the serial connection of a capacitor 166 and control diode 168 connected from the junction of capacitors 158 and 160 to ground. Conduction of diode 168 is controlled for effectively changing the capacitance of the shunt arm between that of the diode and that of the capacitor, their values differing by about an order of magnitude, thereby controlling the coupling coefficient of coupling section 116.

Within tuned circuit section 112, inductor 164 forms the primary winding of a transformer 165, of which the secondary winding 174 has its upper terminal connected through the serial combination of a capacitor 170 and control diode 172 to ground, and its lower terminal connected directly to ground. Diode 172 selectively connects the capacitor 170, with a magnitude reduced by the transformer, in shunt with capacitor 162 and inductor 164 for compensation.

Coupling section 118 includes a first series capacitor 176, a second series capacitor 178 and a shunt capacitor 180 serially connected with a control diode 182 from the junction of capacitors 176 and 178 to ground. The first series capacitor 176 is connected to the upper junction of tuning components 162 and 164 of section 112. The second series capacitor 178 is connected to the upper junction of the shunt connected tuning components of tuned circuit section 114, capacitor 184 and inductor 186, whose lower junction is connected to ground. Section 114 also includes the serial combination of RF bypass capacitor 188, load resistor 190 and control diode 192 connected from the upper junction of tuning components 184 and 186 to ground. A resistor 194 is connected from the junction of resistor 190 and diode 192 through bypass capacitor 150 to ground. Diode 192 functions to selectively connect into section 114 either the load resistor 190 alone or the serial combination of resistors 190 and 194 for altering the Q of the section. Within section 114 inductor 186 forms the primary winding of a transformer 187, of which the secondary winding 200 has a capacitor 196 and serially connected control diode 198 connected from its upper terminal to ground, the lower terminal of winding 200 being connected directly to ground. Control of the conduction of diode 198 selectively connects the capacitor 196, with a magnitude reduced by the transformer, in shunt with tuning capacitor 184 for compensation. The output of filter network 100 is taken from across tuned circuit section 114 and connected to the intermediate amplifier stage 104.

The control circuit 225 for operating the bandpass IF filter includes several transistor switches operated in response to control voltages developed from the 19 KHz and 76 KHz pilot signals. The control circuit applies current to the various control diodes of the IF filter circuit for controlling their conduction to selectively connect into the filter circuit the various components which set its IF bandwidth to one of the indicated discrete values. The control circuitry includes a first PNP transistor 230, the emitter of which is connected to a voltage source $V_2$, the collector of which is connected through a bias resistor 232 to ground and the base of which is connected through a resistor 234 to a control terminal 236. Terminal 236 is energized to supply a control voltage during both biphonic and quadraphonic reception. The collector electrode of transistor 230 is further connected through resistors 148 and 194 to diodes 146 and 192, respectively, for controlling their conduction.

Terminal 236 is shown connected to circuitry that is responsive to the 19 KHz pilot signal, which may be the indicator circuitry contained in the decoder and matrix component 4. This circuitry is schematically represented to include a resistor 238, one end of which is connected to source $V_2$ and the other end connected through a light emitting diode 239 and a PNP transistor 240 to ground. The filtered 19 KHz pilot signal, present during both biphonic and quadraphonic transmission, is applied as a rectified d.c. signal to the base of transistor 240 for causing it to conduct and thereby drop the voltage at the emitter from the positive value of $V_2$ to a value slightly above ground. The emitter is connected to terminal 236.

A second PNP transistor 244 of control circuit 225 has its emitter connected to voltage source $V_2$ and its collector connected through a bias resistor 246 to ground. The base of transistor 244 is connected through a resistor 248 to a control terminal 242 which is energized to supply a control voltage only during a quadraphonic mode of reception. The collector of transistor 244 is also connected through resistors 250, 252, and 254 to diodes 156, 172 and 198, respectively, for controlling the conduction of these diodes, and is further connected through RF bypass capacitor 255 to ground.

Terminal 242 is shown connected to indicator circuitry of decoder and matrix component 4, schematically represented to include a resistor 257, one end of which is connected to source $V_2$ and the other end connected through a light emitting diode 259 and a PNP transistor 261 to ground. The filtered 76 KHz pilot signal is applied as a rectified d.c. signal to the base of transistor 261 for causing it to conduct only during quadraphonic reception, dropping the voltage at the emitter which is connected to terminal 242.

A third PNP transistor 256 has its emitter connected to source $V_2$ and its collector connected through a bias resistor 258 to ground. The base of transistor 256 is connected through a resistor 260 to ground and also is connected to the collector of a fourth PNP transistor 262. The emitter of transistor 262 is connected to voltage source $V_2$ and the base is connected through a resistor 264 to quadraphonic control terminal 242. The collector of transistor 256 is also connected through resistors 266 and 268 to diodes 168 and 182, respectively, for controlling the conduction of these diodes, and is further connected through a RF bypass capacitor 270 to ground.

In one exemplary embodiment of the circuit of FIG. 3, the following component types and component values may be employed, which are given by way of example and not intended to be limiting of applicants' invention:

| Capacitors | |
|---|---|
| 142, 124, 150, 188, 255 | .01 µf |
| 120, 162, 184 | 400 pf |
| 154, 196 | 15 pf |
| 166, 180 | 12 pf |
| 158, 160, 176, 170, 178 | 20 pf |

| Resistors | |
|---|---|
| 144, 190 | 2.7K ohms |
| 148, 194, 260 | 20K ohms |
| 250, 266, 252, 268, 254 | 39K ohms |
| 232, 246, 258 | 4.7K ohms |
| 234, 248, 264 | 10K ohms |
| 238, 257 | 3.9 K ohms |
| Transformers | |
| 165, 123, 187 | 5:2 turns ratio |
| Diodes | |
| 146, 156, 168, 172, 182, 192, 198 | Ordinary silicon |
| 239, 259, 182 | diodes |
| Source Voltage | |
| $V_2$ | 15 V dc |
| Transistors | |
| 244, 256, 262, 230, 240, 261 | GE D29791-8-1 Silicon PNP Type |

With respect to the operation of the circuit of FIG. 3, during monophonic reception no control signal appears at either of control terminals 236 or 242, i.e., the applied voltage is $V_2$, so that transistors 230, 244 and 262 are nonconducting. Transistor 256 is conducting by virtue of its base being connected to the collector of nonconducting transistor 262. Nonconduction of transistor 230 causes diode 146 to be nonconducting and to connect into tuned circuit section 110 the serial combination of resistors 144 and 148. This connection effectively removes the load from this section due to the high resistance of resistor 148 and therefore provides the section with a relatively high Q. Similarly, diode 192 is caused to be nonconducting so as to insert into tuned circuit section 114 the serial combination of resistors 190 and 194 for providing a relatively high Q to this section. In the exemplary embodiment given, the value of Q was approximately 80 during monophonic reception. Conduction of transistor 256 provides current to diode 168 of coupling section 116 for making this diode conductive and connecting into the circuit the capacitor 166. Similarly, diode 182 of coupling section 118 is made to conduct for connecting into the circuit the capacitor 180. The insertion of capacitors 166 and 180 into coupling sections 116 and 118 provide a relatively low coupling coefficient (k) for these coupling sections. In the given exemplary embodiment, k was equal to approximately 0.7 during monophonic reception. During this mode of reception the nonconduction of transistor 244 causes diodes 156, 172 and 198 of tuned circuit sections 110, 112 and 114, respectively, to be nonconducting. Thus, the associated compensating capacitors are effectively decoupled from the tuned circuit sections for this portion of the operation.

The relatively low coupling coefficient for coupling sections 116 and 118 is due to connection of a relatively high capacitance into the shunt arm of these coupling sections, which capacitance in the example provided above has a value of about 12 pf. As will be seen during quadraphonic reception, the diodes 168 and 182 are made nonconducting and their capacitance becomes the effective capacitance of the shunt arm, which is in the order of 1 pf. Thus, by controlling the diodes between their conducting and nonconducting states, the shunt arm capacitance of the coupling sections is effectively switched between the capacitance of the shunt arm capacitor and the capacitance of the diode, providing a discrete adjustment of the shunt arm capacitance, and therefore also its impedance, in a ratio of about 12:1. It is also noted that the serial combination of a capacitor and diode provided in the shunt arm of the coupling sections, with the diode connected to a common point in the circuit, does not introduce any loading of the tuned circuit sections by the control circuit when the diodes are conducting.

Figure 4:
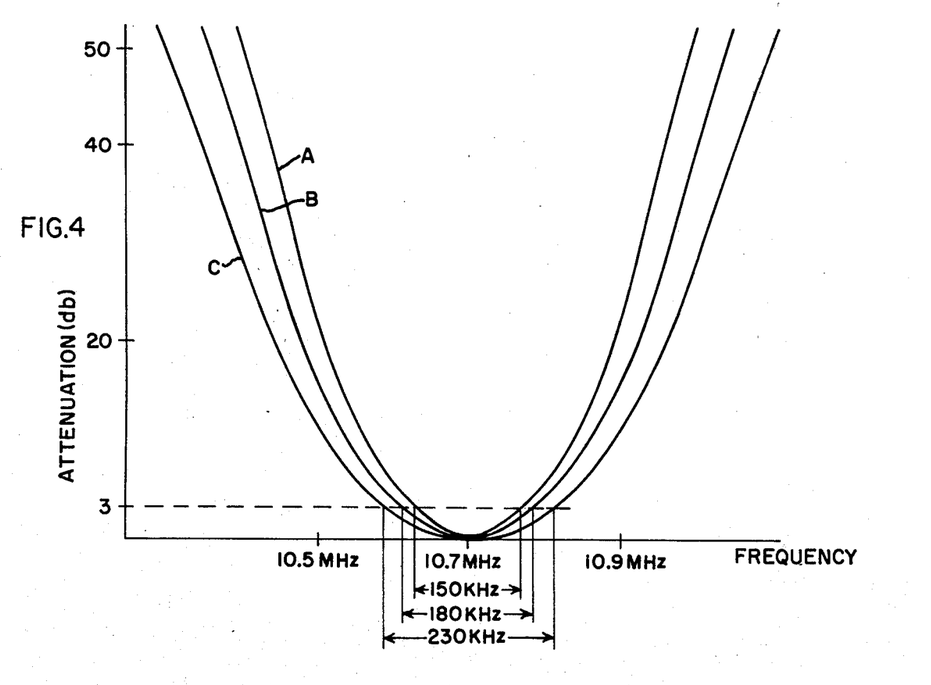
FIG. 4 is a graph illustrating the attenuation versus frequency characteristics of the controllable bandwidth IF filter of FIG. 3.

Accordingly, during a monophonic operation, the tuned circuit sections 110 and 114 are caused to exhibit a relatively high Q, and the coupling sections 116 and 118 to exhibit a relatively low coefficient coupling. It should be understood that identical adjustments are made within the filter network 102. These adjustments within the IF filter provide a relatively narrow IF bandwidth, on the order of 150 KHz at the 3 db attenuation points. The frequency versus attenuation characteristic of the filter for monophonic operation is illustrated by curve "A" in FIG. 4.

During a biphonic mode of reception, a biphonic control signal appears at terminal 236, i.e., the voltage drops to near ground, which causes transistor 230 to conduct. This in turn applies current to diodes 146 and 192 of tuned circuit sections 110 and 114, respectively, to connect into the circuits only the relatively low resistance of resistors 144 and 190. This reduces the Q of these sections for increasing the IF bandwidth. In the exemplary embodiment given, the Q is decreased to approximately 50 during biphonic reception. Operation of the other transistors of the control circuit remain as in the monophonic mode of reception, so that the coupling sections continue to exhibit a relatively low $k$. With similar adjustment taking place in filter network 102, the IF filter bandwidth is increased to about 180 KHz at the 3 db attenuation points. The frequency vs. attenuation characteristic of the filter for the biphonic mode of operation is shown by the curve "B" in FIG. 4.

For a quadraphonic mode of reception, a quadraphonic control signal is applied to the control terminal 242, i.e., a voltage of $V_2$, this voltage also continuing to be present at control terminal 236. Accordingly, transistors 244 and 262 become conductive, and transistor 230 continues to conduct. Transistor 256 becomes nonconducting due to the conduction of transistor 262. Control current continues to be supplied to diodes 146 and 192 of tuned circuit sections 110 and 114 to retain the low resistance connection of resistors 144 and 190 and maintain the low Q for these sections. Nonconduction of transistor 256 removes control current from diodes 168 and 182 in the shunt arms of coupling sections 116 and 118, respectively. Thus, these diodes now appear in the circuit as very low capacitances, an order of magnitude lower than that of their serially connected capacitors, the diode capacitance becoming the effective capacitance in each shunt arm. This decreased capacitance, or increased impedance, acts to increase the coupling coefficient of these sections. In the exemplary embodiment considered, $k$ is increased to approximately 1. A similar increase in $k$ is provided in the tuned circit sections of filter network 102 which, in total, widens the IF filter bandwidth to about 230 KHz at the 3 db attenuation points. This is shown by graph "C" in FIG. 4. It is noted that with the diodes 168 and 182 nonconducting, the control circuit through resistors 266 and 268 provide some loading of the tuned circuit sections. However, this loading is not disadvantageous in this mode of reception since its effect is in a direction to further reduce the Q, which contributes to the widening of the IF bandwidth.

Because the coupling capacitance is changed when switching to quadraphonic reception, there is a tendency for the center frequency of the IF filter to shift. This is compensated for by modifying the shunt capacitance of the tuned circuit sections 110, 112, and 114. Accordingly, conduction of transistor 244 applies current to diodes 156, 172 and 198 causing them to conduct. Conduction of diode 156 connects capacitance 154 into the tuned circuit section 110. The capacitance of capacitor 154 is reflected back into the primary in shunt with the capacitor 120 so as to increase the shunt capacitance of this section. The value of the capacitance reflected back into the primary is that of the capacitor divided by the square of the transformer turns ratio. In the exemplary embodiment given the turns ratio is 5:2 so that the value of the capacitance in the primary circuit is about 1/6 of its value in the secondary circuit. By means of the noted transformer coupling, a compensating shunt capacitance of relatively low value can be connected into the circuit under the control of a switching diode, a substantial differential in added shunt capacitance existing for the uncompensated and compensated conditions.

Similarly, the conduction of diodes 172 and 198 of tuned circuit sections 112 and 114 couple into the circuit the associated capacitors 170 and 196, respectively, for increasing the shunt capacitance of these sections. The increased shunt capacitance of the tuned circuit sections serves to compensate for the decreased capacitance in the shunt arms of the coupling sections. Thereby, the center frequency of the IF filter may be maintained substantially constant when switching from a monophonic or biphonic mode of reception to a quadraphonic mode of reception.

Figure 5:
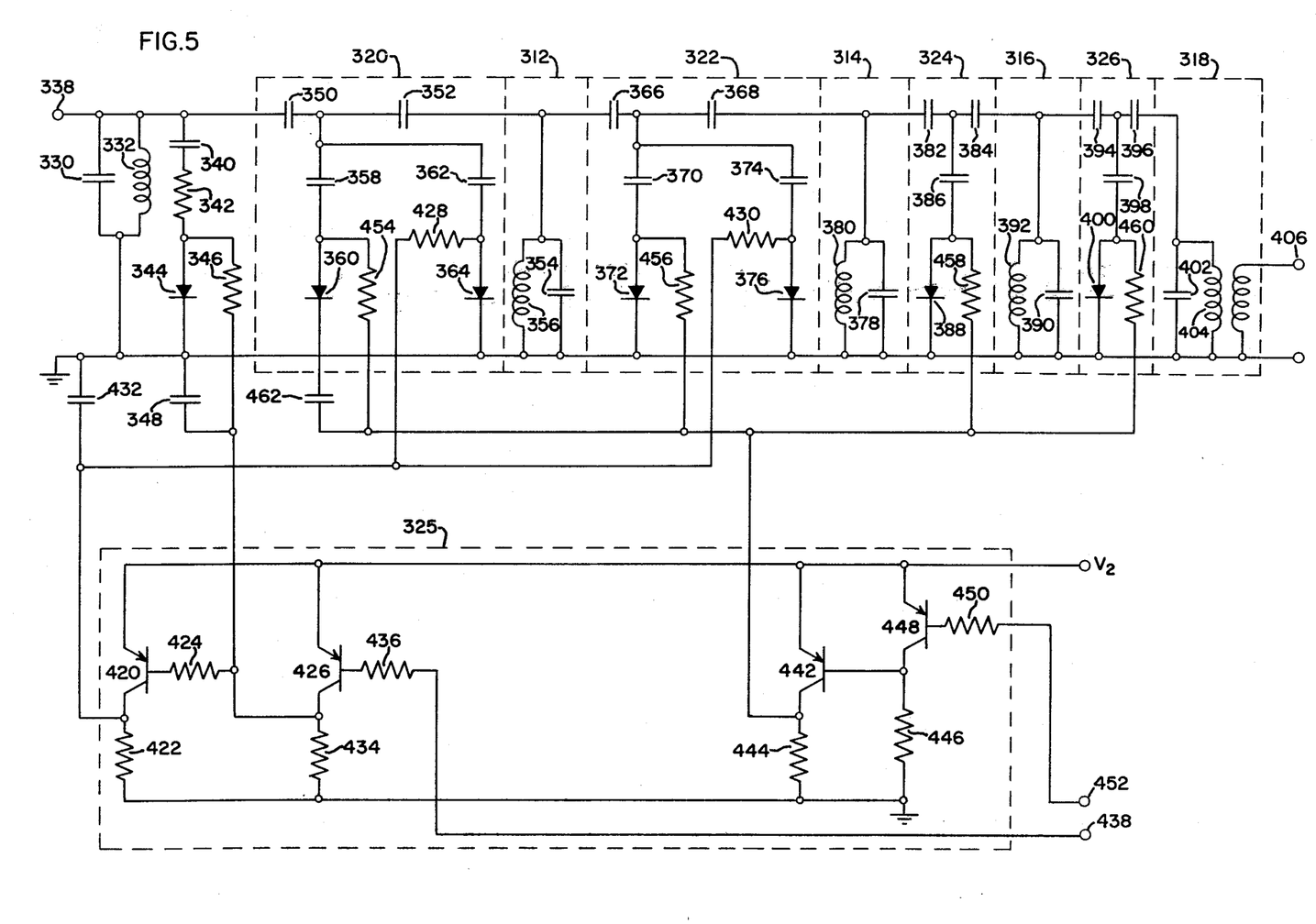
FIG. 5 is a schematic circuit diagram of a second embodiment of a controllable bandwidth IF filter circuit, in accordance with the invention.

In FIG. 5 there is illustrated schematic circuit diagram of a further embodiment of a controllable bandwidth IF filter. The IF filter of FIG. 5 is a five stage filter comprising LC tuned circuit sections 310, 312, 314, 316 and 318 coupled together by capacitive coupling sections 320, 322, 324 and 326. Fewer total components are employed in this embodiment of the invention. Furthermore, no compensation circuit is included, although it could be employed in similar fashion to FIG. 3.

Tuned circuit section 310 includes a capacitor 330 connected in parallel with an inductor 332, the lower junction of which is connected to ground. An input terminal 388 is connected to the upper junction of tuning components 330 and 332. Section 310 further includes the series connection of a RF bypass capacitor 340, resistor 342 and control diode 344 connected from the upper junction of components 330 and 332 to ground. As in the embodiment of FIG. 3, diode 344 and all other control diodes in the filter circuit have their cathodes connected to a common point in the circuit, in this case ground. The junction of resistor 342 and diode 344 is connected by the serial combination of a resistor 346 and bypass capacitor 348 to ground. As described in the previous embodiment, diode 344 is controlled so as to selectively connect into the circuit only the resistor 342 alone or the serial combination of resistors 342 and 346 for varying the Q of the tuned circuit section 310.

Coupling section 320 comprises a pair of series arms and a shunt arm, the first series arm including a capacitor 350 connected to the output of section 310 at the upper junction of tuning components 330 and 332. The second series arm includes a capacitor 352 connected to the input of tuned circuit section 312 at the upper junction of its parallel connected tuning components, capacitor 354 and inductor 356, the lower junction of these components being connected to ground. The shunt arm of coupling section 320 is connected from the junction of capacitors 350 and 352 to ground and comprises two paths. The first path includes the serial connection of a capacitor 358 and a control diode 360, and the second path includes the serial connection of a capacitor 362 and control diode 364.

Similarly, coupling section 322 comprises a pair of series arms and a shunt arm, the first series arm including a capacitor 366 connected to the output of tuned circuit section 312 at the upper junction of tuning components 354 and 356. The second series arm includes a capacitor 368 connected to the input of tuned circuit section 314 at the upper junction of its parallel connected tuning components, capacitor 378 and inductor 380, the lower junction of which are connected to ground. The shunt arm of coupling section 322 is connected from the junction of capacitors 366 and 368 to ground and comprises two paths, the first path including the serial connection of a capacitor 370 and control diode 372, and the second path including the serial connection of a capacitor 374 and control diode 376. The control diodes in the shunt paths of coupling sections 320 and 322 provide a selective connection of the capacitances within these shunt paths for controlling the coupling coefficient of these coupling sections. This operation will be described in greater detail subsequently.

Coupling section 324 comprises a first series capacitor 382 connected to the output of tuned circuit section 314 at the upper junction of components 378 and 380, and a second series capacitor 384 connected to the input of tuned circuit section 316 at the upper junction of its tuning components. Capacitor 390 and inductor 392, the lower junction of which is at ground. A single shunt path in coupling section 324 is connected from the junction of capacitors 382 and 384 to ground, which includes the serial connection of a capacitor 386 and control diode 388.

Coupling section 326 comprises a first series capacitor 394 connected to the output of tuned circuit section 316 at the upper junction of components 390 and 392, and a second series capacitor 396 connected to the input of the final tuned circuit section 318 at the upper junction of its junction component, capacitor 402 and inductor 404, the lower junction of which is at ground. Coupling section 326 includes a single shunt path coupled from the junction of capacitors 394 and 396 to ground and including the serial connection of a capacitor 398 and diode 400. The output of the IF filter is taken through a transformer coupling from inductor 404 and appears at output terminal 406.

The control circuit 325 for operating the bandpass IF filter circuit includes several transistor switches operated in response to control voltages developed from the 19 KHz and 76 KHz pilot signals. The control circuit is of modified form with respect to the control circuit 255 of FIG. 3 and includes a first PNP transistor 420, the emitter being connected to a voltage source $V_2$, the collector being connected through a resistor 422 to ground and the base being connected through a resistor 424 to the collector of a second PNP transistor 426. The collector of transistor 420 is also connected through resistors 428 and 430 to diodes 364 and 376, respectively, for controlling their conduction, and through RF bypass capacitor 432 to ground. Transistor 426 has its emitter connected to voltage source $V_2$ and its collector connected through a bias resistor 434 to ground. The base of transistor 426 is connected through a resistor 436 to a control terminal 438, which is energized by a control signal during a biphonic mode of reception. The collector of transistor 426 is also connected through resistor 346 to diode 344 for controlling its conduction.

A third PNP transistor 442 has its emitter connected to voltage source $V_2$ and its collector connected through a bias resistor 444 to ground. The base of transistor 442 is connected through resistor 446 to ground and also to the collector of a transistor 448, the emitter of transistor which is connected to source $V_2$. The base of transistor 448 is connected through resistor 450 to a control terminal 452 which is energized by a control signal during a quadraphonic mode of reception. The collector of transistor 442 is further connected through resistors 454, 456, 458 and 460 to diodes 360, 372, 388 and 400, respectively, for controlling their conduction, and through RF bypass capacitor 462 to ground.

The control signals applied to terminals 452 and 438 may be derived from circuitry responsive to the 19 KHz and 76 KHz pilot signals which is identical to that illustrated in FIG. 3. Thus, the applied control signals are in the form of voltages of the same magnitude as described with respect to FIG. 3.

In one exemplary embodiment of the circuit of FIG. 5, the following component types and component values may be employed, which are given by way of example and are not intended to be limiting of applicants' invention:

| Capacitors | |
| --- | --- |
| 330, 354, 378, 390, 402 | 400 pf |
| 340, 432, 348, 462 | .01 µf |
| 350, 352, 366, 368, 382, 384, 394, 396 | 20 pf |
| 358, 370, 386, 398 | 10 pf |
| 362, 374 | 33 pf |

| Resistors | |
| --- | --- |
| 342 | 2.7 K ohms |
| 346, 446 | 20 K ohms |
| 360, 428, 456, 430, 458, 460 | 39 K ohms |
| 422, 434, 444 | 4.7 K ohms |
| 424 | 510 K ohms |
| 436, 450 | 10 K ohms |
| Transistors | |
| 420, 426, 442, 448 | GE D29791-8-1 Silicon PNP Type |
| Diodes | |
| 344, 440, 364, 372, 376, 388, 400 | Ordinary silicon diodes |
| Source Voltages | |
| $V_2$ | 15 V dc |

With respect to the operation of the circuit of FIG. 5, during monophonic reception no signal appears at either of the control termsinals 438 or 452, i.e., the applied voltages $V_2$, so that transistors 436 and 448 are nonconducting. Transistors 420 and 442 are conducting by virtue of their base electrodes being connected to the collector electrodes of nonconducting transistors 426 and 448. Conduction of transistor 420 provides current to diodes 364 and 376 in the second shunt paths of coupling sections 320 and 322, respectively, for making these diodes conductive and connecting into the circuit the associated shunt capacitors 362 and 374. Similarly, conduction of transistor 442 provides current to diodes 360, 372, 388, and 400 in the first shunt paths of each of the coupling sections for connecting into the circuit the associated capacitors 358, 370, 386 and 398. By connecting into the circuit each of the shunt capacitors in the coupling sections there is provided a relatively low coupling coefficient ($k$) for the coupling sections, $k$ being equal to approximately 0.7 in sections 324 and 326, and slightly less in sections 320 and 322, during monophonic reception in the exemplary embodiment of the invention. In addition, during this mode of reception the nonconduction of transistor 426 causes diode 344 to be nonconducting and to connect into the tuned circuit section 310 the serial combination of resistors 342 and 346 which provide the section with a relatively high Q.

The relatively low coupling coefficient for the coupling sections is due to connection of a relatively high capacitance in the shunt arm of each of the coupling sections, the capacitance in sections 320 and 322 being double that of the other coupling sections because of the dual shunt paths provided in these first two sections. In the exemplary embodiment given the shunt capacitance in sections 320 and 322 is about 43 pf and shunt capacitance in sections 324 and 326 is about 10 pf. The indicated relatively low coupling coefficient together with the relatively high Q in the tuned circuit section 310 combines to provide a relatively narrow IF filter bandwidth, on the order of 150 KHz as illustrated by curve "A" in FIG. 4.

During a biphonic mode of reception, a biphonic control signal appears at terminal 438 which causes transistor 426 to conduct, which in turn causes transistor 420 to become nonconductive. The conduction of transistor 426 applies current to diode 344 to connect into the tuned circuit section 310 only the relatively low resistance of resistor 342, which reduces the Q of the section. In the exemplary embodiment given, the Q is decreased from 80 to approximately 50. Nonconduction of transistor 420 causes diodes 364 and 376 to become nonconductive. The diodes now appear in the circuit as very low capacitances, about an order of magnitude lower than that of their serially connected capacitors, so that the diode capacitance becomes the effective capacitance in the second shunt path of coupling sections 320 and 322. This decreased capacitance, or increased impedance acts to somewhat increase the coupling coefficient of these sections. The transistors 442 and 448 do not change their operation so that capacitors 358, 370, 386 and 398 remain connected in the first shunt paths of each of the coupling sections. Thus, K is made to be about 0.6 in each coupling section, for the exemplary embodiment being considered. The combined effect of the loading of tuned circuit section 310 and the increased coupling of sections 320 and 322 act to increase the IF filter bandwidth to in the order of 180 KHz, shown by graph "B" in FIG. 4.

In a quadraphonic mode of reception, a quadraphonic control signal is present at the control terminal 452, the biphonic control signal being also present at control terminal 438. This causes transistor 448 to conduct, which in turn makes transistor 442 nonconducting, the state of transistors 420 and 426 remaining unchanged. Nonconduction of transistor 442 causes diodes 360, 372, 388 and 400 in the first shunt paths of each coupling section to become nonconductive and the capacitance of these diodes therefore becomes the effective capacitance in the first shunt paths. For this operation, the coupling coefficient $k$ in each of the coupling sections is thereby increased to about 1.0 and the IF filter bandwidth also increases to about 230 Khz, as shown by graph "C" in FIG. 4.

It is noted that during biphonic and quadraphonic modes of reception, the control circuit 325 acts to load the tuned circuit sections of the IF filter to a small extent, but the loading is in the direction of decreasing the value of Q and therefore increasing the IF bandwidth, which is consistent with the overall control function.

It may be appreciated that numerous changes and modifications can be made to the present circuitry without exceeding the basic teaching provided herein. The appended claims, therefore, are intended to include within their true scope all such changes and modifications.

What is claimed as new and desired to be secured by Letters Patent of the U.S. is:

1. A controllable bandwidth filter circuit comprising:
   a. an input terminal, an output terminal and a common terminal,
   b. a plurality of tuned circuit sections,
   c. capacitive coupling sections connected intermediate said tuned circuit sections for joining them together in a cascade arrangement between said input and output terminals,
   d. said tuned circuit and capacitive coupling sections being composed of fixed and switchable filter elements,
   e. the switchable filter elements of said tuned circuit sections and of said capacitive coupling sections being connected into the filter circuit by semiconductor switching means having a common connection to said common terminal, and
   f. control means for selectively energizing said semiconductor switching means so as to selectively connect said switchable filter elements into the filter circuit, whereby the bandwidth of said filter circuit is adjustable to more than a single value.

2. A filter circuit as in claim 1 wherein said switchable filter elements provide adjustment of the coupling coefficient of said capacitive coupling sections and adjustment of the Q of at least one tuned circuit section.

3. A filter circuit as in claim 2 wherein said control means includes a source of energizing potential and a plurality of control transistors which selectively apply said source to said semiconductor switching means.

4. A controllable bandwidth IF filter circuit for use in a radio receiver that is capable of receiving broadcasts in either the quadraphonic, biphonic or monophonic mode, whose bandwidth is controlled as a function of the broadcast mode received, comprising:
   a. an input terminal, an output terminal and a common terminal,
   b. a plurality of tuned circuit sections,
   c. capacitive coupling sections connected intermediate said tuned circuit sections for joining them together between said input and output terminals,
   d. said tuned circuit and capacitive coupling sections being composed of fixed and switchable filter elements,
   e. the switchable filter elements of said tuned circuit sections and of said capacitive coupling sections being connected into the filter circuit by diode means having a common connection to said common terminal,
   f. signal means for generating first and second control signals which are indicative of a biphonic or quadraphonic received (the) broadcast mode, (received) respectively, and g. control means responsive to said first and second control signals for selectively energizing said diode means so as to selectively connect said switchable filter elements into the filter circuit for providing an adjustment of the IF bandwidth as a function of the broadcast mode received.

5. A filter circuit as in claim 4 wherein said switchable filter elements provide adjustment of the coupling coefficient of said capacitive coupling sections and adjustment of the Q of at least one tuned circuit section.

6. A filter circuit as in claim 5 wherein said control means includes a source of energizing potential and a plurality of control transistors which selectively apply said source to said diode means.

7. A FM radio receiver that is capable of receiving broadcasts in either the quadraphonic, biphonic or monophonic mode, the received signal including a first pilot tone when in the biphonic mode and an additional second pilot tone when in the quadraphonic mode, said radio receiver comprising:

a. converter circuit means for converting the received signal to an IF signal, b. demodulator circuit means for demodulating the IF signal and deriving the audio frequency spectrum, c. decoder and matrix circuit means for providing separation of the audio signals within the audio frequency spectrum when receiving in the biphonic and quadraphonic modes, and for detecting said first and second pilot tones, d. filter circuit means coupled between the converter circuit means and the demodulator circuit means for filtering the IF signal, said filter circuit means having a bandwidth that is controlled as a function of the broadcast mode received for optimizing the receiver protection ratio and signal to noise ratio, and including:

1. an input terminal, an output terminal and a common terminal, 2. a plurality of tuned circuit sections, 3. capacitive coupling sections connected intermediate said tuned circuit sections for joining them together between said input and output terminals, 4. said tuned circuit and capacitive coupling sections being composed of fixed and switchable filter elements, 5. the switchable filter elements of said tuned circuit sections and said capacitive coupling sections being connected into the filter circuit means by diode means having a common connection to said common terminal, and 6. control means responsive to the detected first and second pilot means tones for selectively energizing said diode means so as to selectively connect said filter elements into the filter circuit means for providing an adjustment of the IF bandwidth as a function of the broadcast mode received.

8. A controllable bandwidth filter circuit comprising:

a. an input terminal, an output terminal and a common terminal, b. a plurality of tuned circuit sections, c. capacitive coupling sections connected intermediate said tuned circuit sections for joining them together in a cascade arrangement between said input and output terminals, d. said tuned circuit and capacitive coupling sections being composed of fixed and switchable filter elements, e. the switchable filter elements of said tuned circuit sections and of said capacitive coupling sections being connected into the filter circuit by semiconductor switching means having a common connection to said common terminal, f. the fixed and switchable filter elements of each of said capacitive coupling sections including a capacitive series arm connected in series between adjacent tuned circuit sections and a capacitive shunt arm connected between a point on said series arm and said common terminal, said capacitance shunt arm including a path having therein a capacitance and a first semiconductor switching device of said semiconductor switching means one side of which is connected to said common terminal, and g. control means for selectively energizing said semiconductor switching means of the tuned circuit sections and the capacitive coupling sections, the first semiconductor switching devices functioning to selectively connect their associated capacitances into the filter circuit for effecting incremental changes in the coupling coefficient of said coupling sections, whereby the bandwidth of said filter circuit is adjustable to more than a single value.

9. A filter circuit as in claim 8 wherein said tuned circuit sections each include a shunt connected tuning capacitance and inductance coupled from a point intermediate adjacent coupling sections to said common terminal, and at least one tuned circuit section also includes a resistance connected in shunt with the tuning capacitance and inductance of its associated tuned circuit section, and a second semiconductor switching device one side of which is connected to said common terminal and its other side connected to a point on said resistance, said second device functioning to variably connect said resistance into the filter circuit for varying the loading of its associated tuned circuit section whereby the entire resistance appears in the filter circuit when said second device is de-energized and only a portion of said resistance appears in the filter circuit when said second device is energized.

10. A filter circuit as in claim 9 wherein at least one tuned circuit section also includes a compensating capacitance, transformer means for coupling said compensating capacitance in shunt with the tuning capacitance and inductance of its associated tuned circuit section, and a third semiconductor switching device one side of which is connected to said common terminal and its other side connected to said compensating capacitance, said third device functioning to selectively connect said compensating capacitance into the filter circuit to compensate for any tuning variation due to changes in coupling coefficient of the capacitive coupling sections.

11. A filter circuit as in claim 9 wherein the capacitive shunt arm of at least one capacitive coupling section includes a further path having therein a further capacitance and third semiconductor switching device one side of which is connected to said common terminal, said third device functioning to selectively connect said further capacitance into the filter circuit for effecting further incremental changes in the coupling coefficient of its associated coupling section.

12. A controllable bandwidth IF filter circuit for use in a radio receiver that is capable of receiving broadcasts in either the quadraphonic, biphonic or monophonic mode, whose bandwidth is controlled as a function of the broadcast mode received, comprising:
  a. an input terminal, an output terminal and a common terminal,
  b. a plurality of tuned circuit sections,
  c. capacitive coupling sections connected intermediate said tuned circuit sections for joining them together between said input and output terminals,
  d. said capacitive coupling sections each including a capacitive series arm connected in series between adjacent tuned circuit sections and a capacitive shunt arm connected between a point on said series arm and said common terminal, said capacitive shunt arm including a path having therein a capacitor and a first control diode one side of which is connected to said common terminal,
  e. signal means for generating first and second control signals which are indicative of a biphonic or quadraphonic received broadcast mode, respectively,
  f. control means responsive to said first and second control signals for causing the first diodes to conduct for connecting their associated capacitors into the filter circuit and effecting a relatively low coupling coefficient of said coupling sections during monophonic and biphonic reception, and for causing said first diodes to be nonconductive for disconnecting their associated capacitors from the filter circuit and effecting a relatively high coupling coefficient of said coupling sections during quadraphonic reception, and
  g. each tuned circuit section includes a shunt connected tuning capacitance and inductance and at least one tuned circuit section also includes a resistance connected in shunt with the tuning capacitance and inductance of its associated tuned circuit section, and a second control diode one side of which is connected to said common terminal and its other side connected to a point on said resistance, said control means actuating said second diode to variably connect said resistance into the filter circuit whereby the entire resistance appears in the filter circuit when said second diode is nonconducting during monophonic reception and only a portion of said resistance appears in the filter circuit when said second diode is conducting during biphonic and quadraphonic reception, so as to provide a relatively high Q for the filter circuit during monophonic reception and a relatively low Q during biphonic and as quadraphonic reception.

13. A filter circuit as in claim 12 wherein at least one tuned circuit section also includes a compensating capacitance, transformer means for coupling said compensating capacitance in shunt with the tuning capacitance and inductance of its associated tuned circuit section, and a third (c) control diode (of) one side of which is connected to said common terminal and its other side connected to said compensating capacitance, said control means causing said third control diode to conduct during quadraphonic reception and thereby selectively connect said compensating capacitance into the filter circuit to compensate for any tuning variation due to changes in coupling coefficient of the capacitive coupling sections.

14. A filter circuit as in claim 12 wherein the capacitive shunt arm of at least one capacitive coupling section includes a further path having therein a further capacitor and third control diode one side of which is connected to said common terminal, said control means causing said third diode to conduct and thereby connect said further capacitor into the filter circuit for further reducing the coupling coefficient of its associated coupling section during monophonic reception.

15. A FM receiver that is capable of receiving broadcasts in either the quadraphonic, biphonic or monophonic mode, the received signal including a first pilot tone when in the biphonic mode and an additional second pilot tone when in the quadraphonic mode, said radio receiver comprising:
  a. converter circuit means for converting the received signal to an IF signal,
  b. demodulator circuit means for demodulating the IF signal and deriving the audio frequency spectrum,
  c. decoder and matrix circuit means for providing separation of the audio signals within the audio frequency spectrum when receiving in the biphonic and quadraphonic modes, and for detecting said first and second pilot tones,
  d. filter circuit means coupled between the converter circuit means and the demodulator circuit means for filtering the IF signal, said filter circuit means having a bandwidth that is controlled as a function of the broadcast mode received for optimizing the receiver protection ratio and signal to noise ratio, and including:
    1. an input terminal, an output terminal and a common terminal,
    2. a plurality of tuned circuit sections,
    3. capacitive coupling sections connected intermediate said tuned circuit sections for joining them together between said input and output terminals,
    4. said capacitive coupling sections each including a capacitive series arm connected in series between adjacent tuned circuit sections and a capacitive shunt arm connected between a point on said series arm and said common terminal, said capacitive shunt arm including a path having therein a capacitor and a first control diode one side of which is connected to said common terminal,
    5. control means responsive to the detected first and second pilot tones for causing the first diodes to conduct for connecting their associated capacitors into the filter circuit means and effecting a relatively low coupling coefficient of said coupling sections during monophonic and biphonic reception, and for causing said first diodes to be nonconductive for disconnecting their a associated capacitors from the filter circuit means and effecting a relatively high coupling coefficient of said coupling sections during quadraphonic reception, and
    6. each tuned circuit section of said filter circuit means includes a shunt connected tuning capacitance and inductance and at least one tuned circuit section also includes a resistance connected in shunt with the tuning capacitance and inductance of its associated tuned circuit section and a second control diode one side of which is connected to said common terminal and its other side connected to a point on said resistance, said control means actuating said second diode to variably connect said resistance into the filter circuit means whereby the entire resistance appears in the filter circuit means when said second diode is nonconducting during monophonic reception and only a portion of said resistance appears in the filter circuit means when said second diode is conducting during biphonic and quadraphonic reception, so as to provide a relatively high Q for the filter circuit means during monophonic reception and a relatively low Q during biphonic and quadraphonic reception.

16. A radio receiver as in claim 15 wherein at least one tuned circuit section also includes a compensating capacitance, transformer means for coupling said compensating capacitance in shunt with the tuning capacitance and inductance of its associated tuned circuit section, and a third control diode (of) one side of which is connected to said common terminal and its outer side connected to said compensating capacitance, said control means causing said third control diode to conduct during quadraphonic reception and thereby selectively connect said compensating capacitance into the circuit to compensate for any tuning variation due to changes in coupling coefficient of the capacitive coupling sections.

17. A radio receiver as in claim 15 wherein the capacitive shunt arm of at least one capacitive coupling section includes a further path having therein a further capacitor and third control diode one side of which is connected to said common terminal, said control means causing said third diode to conduct and thereby connect said further capacitor into the filter circuit means for further reducing the coupling coefficient of its associated coupling section during monophonic reception.

18. A radio receiver as in claim 15 wherein said control means includes a source of energizing potential and a plurality of control transistors selectively energized to apply said source to said first and second diodes.

19. A radio receiver as in claim 18 which includes signal means responsive to said first and second pilot tones for generating first and second control signals which are indicative of (the) a biphonic or quadraphonic received broadcast mode (received), respectively, and means for applying said first and second control signals to said control transistors for controlling their conduction.

* * * * *